United States Patent
Muchherla et al.

(10) Patent No.: US 12,334,142 B2
(45) Date of Patent: Jun. 17, 2025

(54) SACRIFICIAL STRINGS IN A MEMORY DEVICE TO DETECT READ DISTURB

(71) Applicant: Micron Technology, Inc., Boise, ID (US)

(72) Inventors: Kishore Kumar Muchherla, Fremont, CA (US); Violante Moschiano, Avezzano (IT); Akira Goda, Tokyo (JP); Jeffrey S. McNeil, Nampa, ID (US); Eric N. Lee, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 292 days.

(21) Appl. No.: 17/877,411

(22) Filed: Jul. 29, 2022

(65) Prior Publication Data

US 2023/0060440 A1    Mar. 2, 2023

Related U.S. Application Data

(60) Provisional application No. 63/260,588, filed on Aug. 26, 2021.

(51) Int. Cl.
| | | |
|---|---|---|
| *G11C 11/4096* | (2006.01) | |
| *G11C 11/406* | (2006.01) | |
| *G11C 11/4072* | (2006.01) | |
| *G11C 11/408* | (2006.01) | |

(52) U.S. Cl.
CPC .... *G11C 11/4096* (2013.01); *G11C 11/40622* (2013.01); *G11C 11/4072* (2013.01); *G11C 11/4085* (2013.01)

(58) Field of Classification Search
CPC .......... G11C 11/4096; G11C 11/40622; G11C 11/4072; G11C 11/4085; G11C 16/08; G11C 16/0483; G11C 16/26; G11C 16/3418; G11C 16/3427
USPC .................................................. 365/230.05
See application file for complete search history.

(56) References Cited

U.S. PATENT DOCUMENTS

| | | | |
|---|---|---|---|
| 2012/0203951 A1* | 8/2012 | Wood | G11C 29/42 |
| | | | 711/E12.008 |
| 2018/0121343 A1* | 5/2018 | Kim | H03K 19/17736 |

\* cited by examiner

*Primary Examiner* — Huan Hoang
*Assistant Examiner* — Daniel J King
(74) *Attorney, Agent, or Firm* — Lowenstein Sandler LLP (57) ABSTRACT

Control logic in a memory device determines to initiate a string read operation on a first memory string of a plurality of memory strings in a block of a memory array, the block comprising a plurality of wordlines, wherein the first memory string is designated as a sacrificial string. The control logic further causes a read voltage to be applied to each of the plurality of wordlines concurrently and senses a level of current flowing through the sacrificial string while the read voltage is applied. In addition, the control logic identifies, based on the level of current flowing through the sacrificial string, whether a threshold level of read disturb has occurred on the block.

20 Claims, 7 Drawing Sheets

SACRIFICIAL STRINGS IN A MEMORY DEVICE TO DETECT READ DISTURB

RELATED APPLICATION

This application claims the benefit of U.S. Provisional Application Ser. No. 63/260,588, filed Aug. 26, 2021, which is herein incorporated by reference in its entirety.

TECHNICAL FIELD

Embodiments of the disclosure relate generally to memory sub-systems, and more specifically, relate to sacrificial strings to detect read disturb in a memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to sacrificial strings to detect read disturb in a memory device of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

During a read operation, a selected memory cell(s) can be read with the application of a read voltage to a selected wordline. During the read operation, a pass voltage can be applied to the unselected wordlines of the memory array to ensure that those unselected wordlines remain electrically transparent and do not interfere with the read operation being performed on the selected wordline. In some memory devices, a higher pass voltage is applied to those unselected wordlines immediately adjacent to the selected wordline on either side, while a lower pass voltage is applied to those unselected wordlines not immediately adjacent to the selected wordline. The application of this higher pass voltage, however, can cause the immediately adjacent wordlines to experience what is known as read disturb. Read disturb is the result of continually reading from memory cells on one wordline without intervening erase operations, causing the level of charge stored at memory cells on other nearby wordlines to change over time (e.g., become programmed). If too many read operations are performed on the memory cells of one wordline, data stored at memory cells of adjacent wordlines of the memory device can become corrupted or incorrectly stored at those memory cells, resulting in a higher error rate of the data stored on the memory device. This can increase the use of an error detection and correction operation (e.g., an error control operation) for subsequent operations (e.g., read and/or write) performed on the memory device. The increased use of the error control operations can result in a reduction of the performance of the memory device and memory sub-system. In addition, as the error rate for a memory cell or block continues to increase, it may even surpass the error correction capabilities of the memory sub-system, leading to an irreparable loss of the data. Furthermore, as more resources of the memory sub-system are used to perform the error control operation, fewer resources are available to perform other read operations or write operations.

Depending on the data access activity of the host system for a particular memory device or memory sub-system, the effects of read disturb can be either focused on one or more particular memory pages in a block or distributed more evenly across all the memory pages of the block. If read stress is focused on a single memory page, for example, the block can be considered to be experiencing single wordline (SWL) read disturb (also referred to as "row hammer" read disturb). Single wordline read disturb can occur in situations where a certain piece of data stored on the memory device is read significantly more often than the rest of the data in the same block. If the read stress is uniformly distributed across multiple memory pages, however, the block can be considered to be experiencing uniform read disturb (also referred to as "full block" read disturb). Uniform read disturb can occur in situations where each piece of data in a block is read with approximately the same frequency.

The error rate associated with data stored at the block can increase due to read disturb. Therefore, upon a threshold number of read operations being performed on the block, certain memory sub-systems can perform a data integrity check (also referred to herein as a "scan") to verify that the data stored at the block does not include any errors. During the data integrity check, one or more reliability statistics are determined for data stored at the block. One example of a reliability statistic is raw bit error rate (RBER). The RBER corresponds to a number of bit errors out of a total number of bits stored at the block. For example, if the reliability statistic for a block exceeds a threshold value, indicating a high error rate associated with data stored at the block due, at least in part, to read disturb, then the data stored at the block is relocated to a new block of the memory sub-system (also referred to herein as "folding"). The folding of the data stored at the block to the other block can include writing the data to the other block to refresh the data stored by the memory sub-system. This can be done to negate the effects of read disturb associated with the data and to erase the data at the block. However, as previously discussed, read disturb can affect memory cells that are adjacent to the memory cell that a read operation is performed on. Therefore, read disturb can induce a non-uniform stress on memory cells of the block if particular memory cells are read from more frequently. For example, memory cells associated with a wordline of a block that are adjacent to a wordline that is frequently read from can have a high error rate, while the memory cells associated with other wordlines that are not adjacent to the memory cell can have a lower error rate due to a reduced impact by read disturb on these memory cells. To identify the individual wordlines experiencing single wordline read disturb would include tracking the read counts of each individual wordline. Since many memory devices can have several hundreds of blocks with several hundreds of wordlines per block, or more, the available memory space (e.g., RAM) is insufficient to support the use of read counters for each wordline and such a tracking scheme would negatively impact performance of the memory device.

Aspects of the present disclosure address the above and other deficiencies by providing a memory device with sacrificial strings to detect read disturb. In one embodiment, each wordline in a block of the memory device can include one or more sacrificial memory cells. These sacrificial memory cells are not made available to the memory sub-system controller, and thus are not used to store host data. Rather, the sacrificial memory cells remain in a default state (e.g., an erased state) or are programmed to a known voltage (e.g., a voltage corresponding to a known state). In one embodiment, one or more sacrificial memory cells of each wordline in the block of the memory device are connected together to form a memory string (e.g., orthogonal to the direction in which the wordlines extend). When a read operation is performed on any of the wordlines in the block, where a read voltage is applied to the selected wordline and a pass voltage is applied to the unselected wordlines, the sacrificial memory cells will experience the same read disturb effects as the memory cells storing host data. When the read disturb effects become strong enough, one or more of the sacrificial memory cells can shift from the default or known state to a different state (e.g., to a state associated with a higher voltage level). Thus, a string sensing operation can be performed periodically on the string of sacrificial memory cells to determine whether read disturb has occurred. In one embodiment, to perform the string sensing operation a predefined read voltage is applied to each wordline of the block concurrently, and the current through the string of sacrificial memory cells is sensed. If any of the sacrificial memory cells in the string has shifted to a different state, the string will not conduct and current will not flow through the string. Thus, in such a situation, it can be determined that read disturb is present in the memory block and corresponding corrective action can be taken, as described in more detail below.

Advantages of this approach include, but are not limited to, improved performance in the memory device. The read disturb effects that manifest on a single wordline can be translated to a string signal (i.e., in the orthogonal direction) and easily detected without incurring significant bandwidth penalty in the memory array associated with scanning each wordline individually. Thus, a low latency string sensing operation can be performed to detect the presence of single wordline read disturb in a block of the memory device. This leads to a lower error rate, and improved reliability and data retention in the memory device. This technique is equally applicable even as the number of wordlines in a block of the memory device increases, and will reduce the number of scan operations performed for read disturb handling which improves the quality of service provided by the memory device.

Figure 1A:
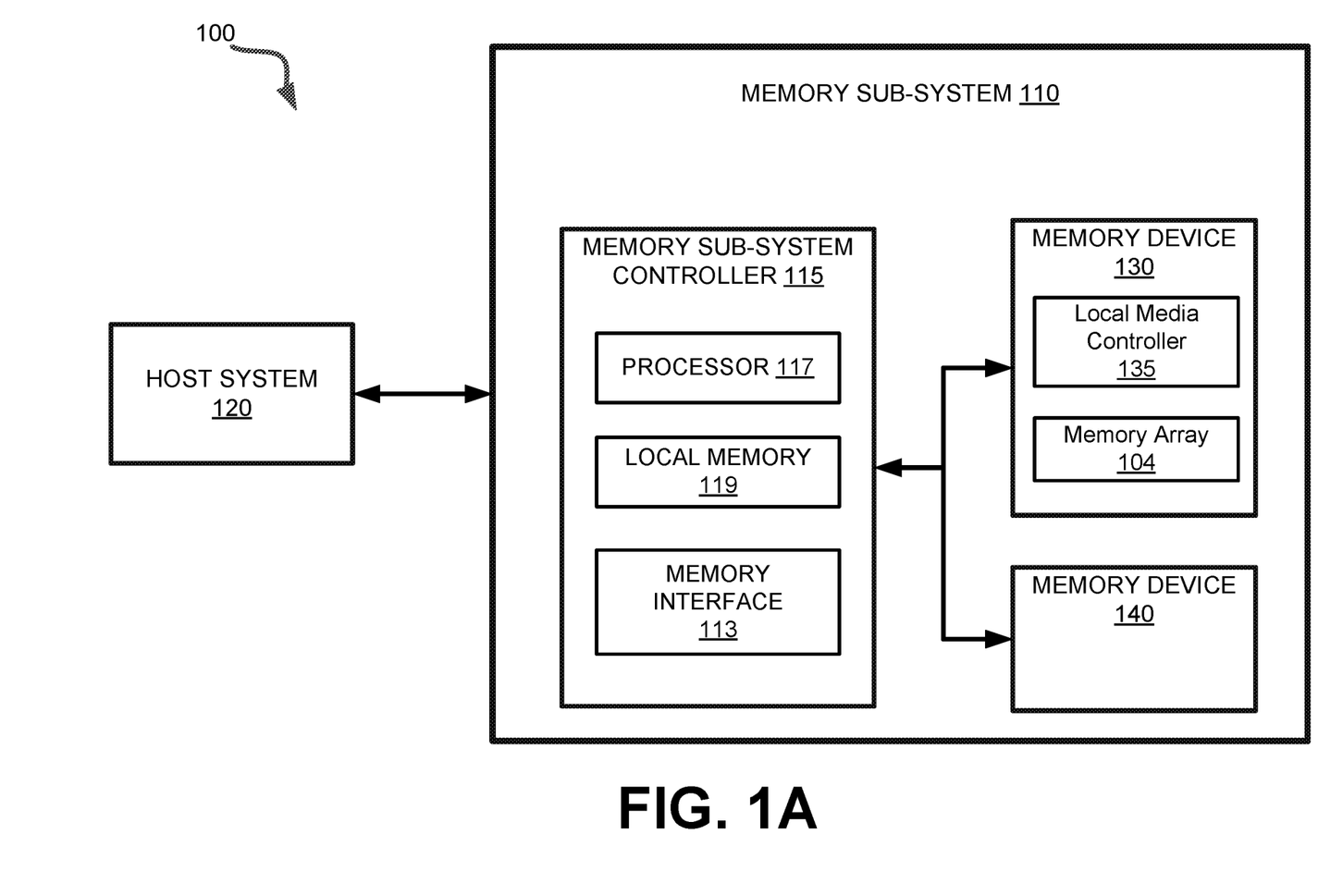
FIG. 1A illustrates an example computing system that includes a memory sub-system in accordance with some embodiments of the present disclosure.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. In some embodiments, the memory sub-system controller 115 includes at least a portion of the memory interface 113. For example, the memory sub-system controller 115 can include a processor 117 (e.g., a processing device) configured to execute instructions stored in local memory 119 for performing the operations described herein. In some embodiments, the memory interface component 113 is part of the host system 110, an application, or an operating system.

In one embodiment, memory device 130 includes local media controller 135 and a memory array 104. As described herein, the memory array 104 can include a number of sacrificial memory cells used to detect the occurrence of read disturb in memory device 130. In one embodiment, each wordline in a block of memory array 104 can include one or more sacrificial memory cells. The sacrificial memory cells can be initialized to a default state (e.g., an erased state) or programmed to a known voltage (e.g., a voltage corresponding to a known state). In one embodiment, one or more sacrificial memory cells of each wordline in the block of memory array 104 are connected together to form a memory string. Periodically local media controller 135 can perform a string sensing operation on the string of sacrificial memory cells to determine whether read disturb has occurred. In one embodiment, to perform the string sensing operation, local media controller can cause a predefined read voltage to be applied to each wordline of the block concurrently, and then sense the current through the string of sacrificial memory cells. If any of the sacrificial memory cells in the string has shifted to a different state (e.g., due to read disturb effects), the string will not conduct so current will not flow through the string, and local media controller 135 can determine that read disturb is present in the block. Local media controller 135 can notify memory interface 113, for example, which can take corrective action, such as performing a data integrity check (e.g., a "scan") to identify the specific wordlines in the block experiencing the highest levels of read disturb, or simply refreshing the entire block. Further details with regards to the operations of local media controller 135 and the use of the sacrificial memory cells in memory array 104 are described below.

Figure 1B:
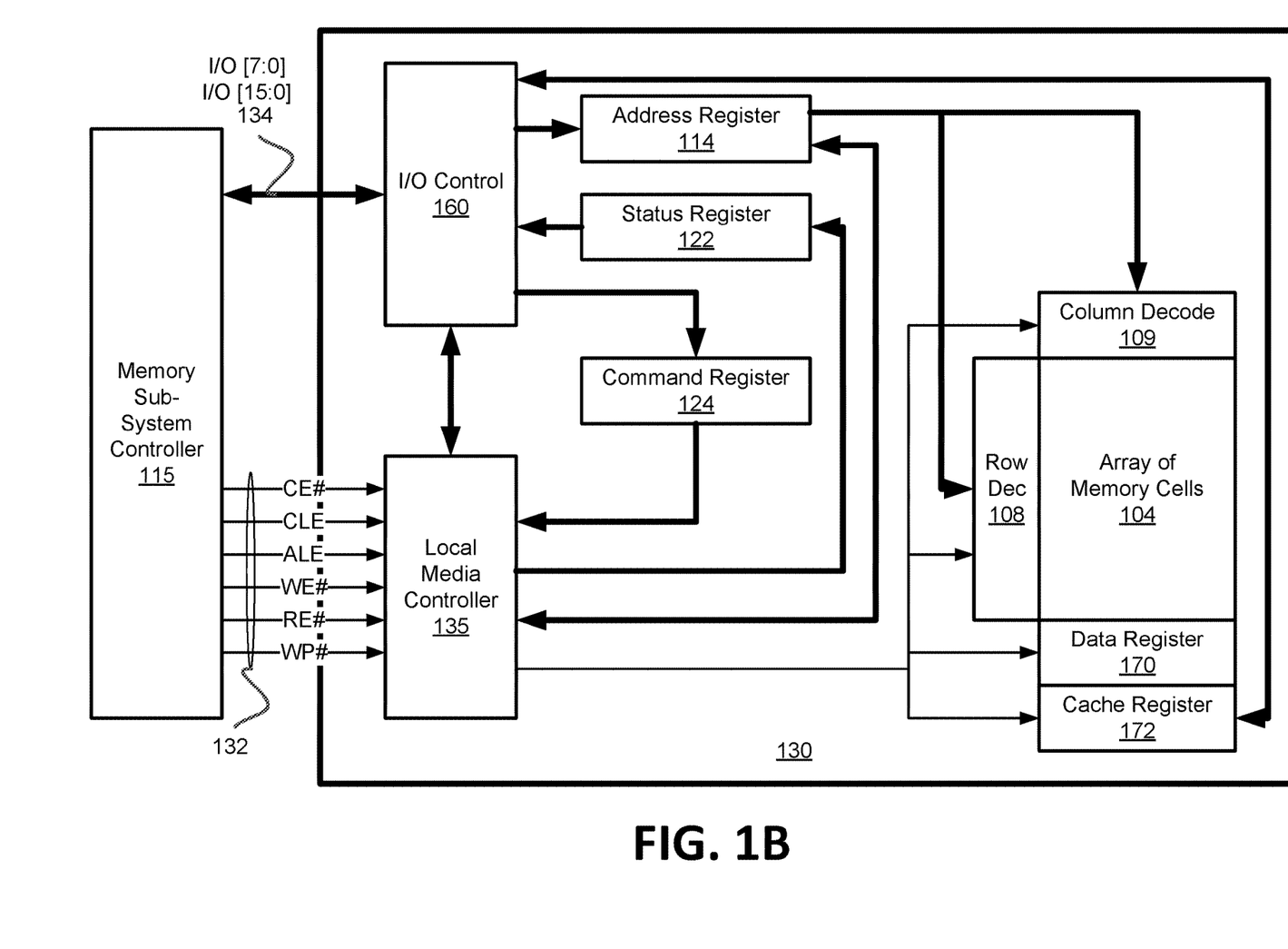
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states. In one embodiment, the array of memory cells 104 (i.e., a "memory array") can include a number of sacrificial memory cells used to detect the occurrence of read disturb in memory device 130, as described in detail herein.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 160 and may then be written into command register 124. The addresses may be received over input/output (I/O) pins [7:0] of I/O bus 134 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
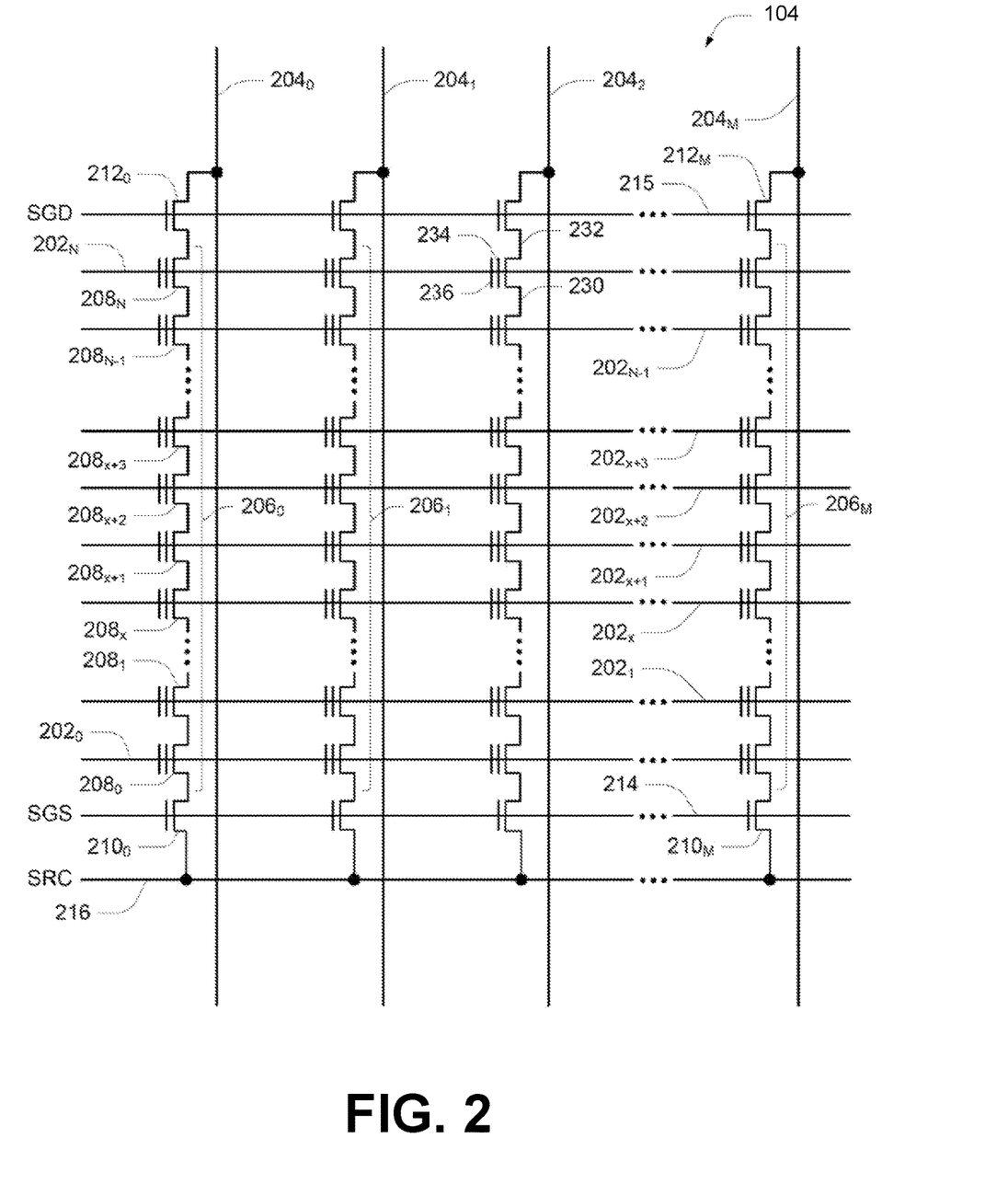
FIG. 2 is a schematic of portions of an array of memory cells as could be used in a memory of the type described with reference to FIG. 1B in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines $202_0$ to $202_N$, and data lines, such as bit lines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

In one embodiment, one or more of NAND strings 206 can be designated as sacrificial strings and used to detect read disturb in memory array 104. For example, NAND string $206_0$ can be designated a sacrificial string. In other embodiments, there can be different NAND strings or additional NAND strings, including two or more NAND strings, which are designated as sacrificial strings. In one embodiment, NAND string $206_0$ can include at least one sacrificial memory cell 208 from each wordline 202. These sacrificial memory cells 208 in the sacrificial memory string $206_0$ are not made available to the memory sub-system controller, and thus are not used to store host data. Rather, the sacrificial memory cells 208 remain in a default state (e.g., an erased state) or are programmed to a known voltage (e.g., a voltage corresponding to a known state). When a read operation is performed on any of the wordlines in memory array 104, a read voltage is applied to the selected wordline and a pass voltage is applied to the unselected wordlines, and the sacrificial memory cells will experience the same read disturb effects as the memory cells storing host data. When the read disturb effects become strong enough, one or more of the sacrificial memory cells can shift from the default or known state to a different state (e.g., to a state associated with a higher voltage level). Thus, local media controller 135 can perform a string sensing operation on the string of sacrificial memory cells to determine whether read disturb has occurred. In one embodiment, to perform the string sensing operation a predefined read voltage is applied to each wordline 202 concurrently, and the current through the sacrificial string $206_0$ is sensed. If any of the sacrificial memory cells 208 in the sacrificial string $206_0$ has shifted to a different state, the sacrificial string $206_0$ will not conduct and current will not flow. Thus, in such a situation, local media controller 135 can determine that read disturb is present in the block of memory array 104.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to wordline $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 104 can be numbered consecutively from bit line $204_0$ to bit line $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
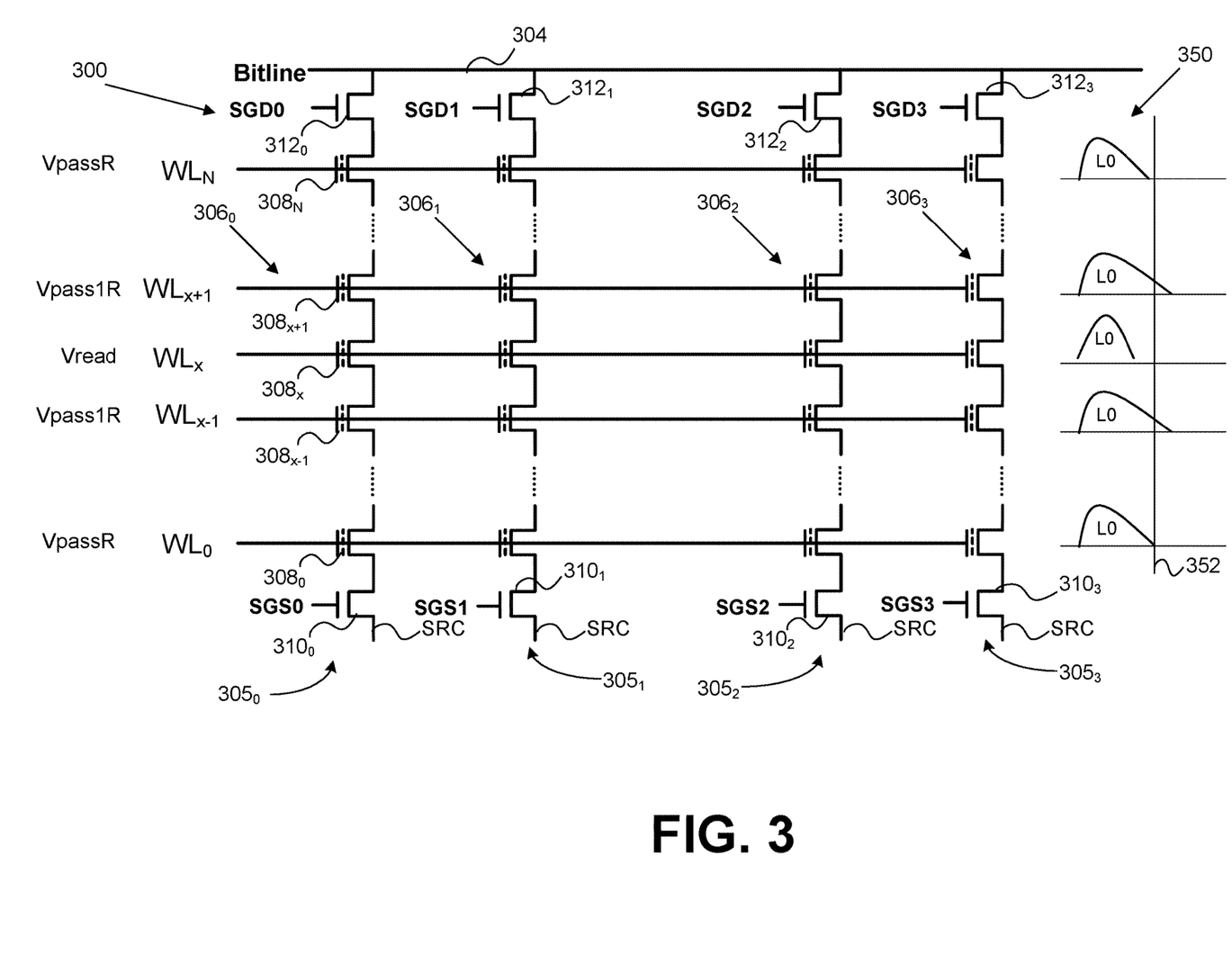
FIG. 3 is a schematic of portions of an array of memory cells including sacrificial strings to detect read disturb in accordance with some embodiments of the present disclosure.

FIG. 3 is a schematic of portions of an array of memory cells including sacrificial strings to detect read disturb in accordance with some embodiments of the present disclosure. The portion of the array of memory cells, such as memory array 104, can be a block 300, for example. In one embodiment, the block 300 includes strings of memory cells that can be grouped into sub-blocks, such as sub-blocks $305_0$-$305_3$. Other numbers of sub-blocks can be included in other embodiments.

Specifically, in at least some embodiments, the block 300 includes a bit line 304, where each sub-block is coupled to the bit line 304. The first sub-block $305_0$ can include a first drain select (SGD) transistor $312_0$, a first source select (SGS) transistor $310_0$, and a first string of memory cells $306_0$ coupled therebetween. The second sub-block $305_1$ can include a second SGD transistor $312_1$, a second SGS transistor $310_1$, and a second string of memory cells $306_1$ coupled therebetween. The third sub-block $305_2$ can include a third SGD transistor $312_2$, a third SGS transistor $310_2$, and a third string of memory cells $306_2$ coupled therebetween. The fourth sub-block $305_3$ can include a fourth SGD transistor $312_3$, a fourth SGS transistor $310_3$, and a fourth string of memory cells $306_3$ coupled therebetween. By way of example, the first string of memory cells $306_0$ includes multiple memory cells $308_0 \ldots 308_N$. Each SGS transistor can be connected to a common source (SRC), such as a source voltage line, to provide voltage to the sources of the multiple memory cells $308_0 \ldots 308_N$. In some embodiments, the source voltage line includes a source plate that supplies the source voltage. In at least some embodiments, multiple wordlines (WLs) are coupled with gates of memory cells of each string of memory cells $306_0 \ldots 306_3$.

In these embodiments, a first drain select gate line (SGD0) can be connected to the gate of the first SGD transistor $312_0$, a second drain select gate line (SGD1) can be connected to the gate of the second SGD transistor $312_1$, a third drain select gate line (SGD2) can be connected to the gate of the third SGD transistor $312_2$, and a fourth drain select gate line (SGD3) can be connected to the gate of the fourth SGD transistor $312_3$. Further, a first source select gate line (SGS0) can be connected to the gate of the first SGS transistor $310_0$, a second source select gate line (SGS1) can be connected to the gate of the second SGS transistor $310_1$, a third source select gate line (SGS2) can be connected to the gate of the third SGS transistor $310_2$, and a fourth source select gate line (SGS3) can be connected to the gate of the fourth SGS transistor $310_3$.

In one embodiment, one or more of memory strings can be designated as sacrificial strings and used to detect read disturb in the block 300. In one embodiment, a single string, such as string $306_0$ is designated as a sacrificial string. In another embodiment, multiple strings, such as strings $306_0$ and $306_1$ are designated as sacrificial strings. In yet another embodiment, one or more strings from each individual sub-block are designated as sacrificial strings. In other embodiments, different and/or additional strings can be designated as sacrificial strings. As illustrated sacrificial string $306_0$ includes at least one sacrificial memory cell $308_0 \ldots 308_N$ from each wordline. These sacrificial memory cells $308_0 \ldots 308_N$ are not made available to the memory sub-system controller, and thus are not used to store host data. A remainder of the block 300, including the memory cells in remaining memory strings $306_1$-$306_3$, which are not designated as sacrificial strings, remain available to store host data (e.g., in response to memory access commands received from memory sub-system controller 115). In one embodiment, the sacrificial memory cells remain in a default state (e.g., an erased state) or are programmed to a known voltage (e.g., a voltage corresponding to a known state). For example, as shown in diagram 350, each wordline can include a distribution of sacrificial memory cells that are initially set to the L0 state (e.g., an erased state).

When a read operation is performed on a wordline of the block 300, such as a selected wordline $WL_x$, a read voltage (Vread) is applied to the selected wordline $WL_x$ and a pass voltage is applied to the unselected wordlines. In one embodiment, a higher pass voltage (Vpass1R) is applied to those unselected wordlines (e.g., $WL_{x+1}$ and $WL_{x-1}$) immediately adjacent to the selected wordline $WL_x$ on either side, while a lower pass voltage (VpassR) is applied to those unselected wordlines (e.g., $WL_N$ and $WL_0$) not immediately adjacent to the selected wordline $WL_x$. As a result of these voltages, the sacrificial memory cells will experience the same read disturb effects as the memory cells storing host data. When the read disturb effects become strong enough, one or more of the sacrificial memory cells can shift from the default or known state to a different state (e.g., to a state associated with a higher voltage level). For example, as shown in diagram 350, the distributions of sacrificial memory cells associated with $WL_{x+1}$ and $WL_{x-1}$ can develop high voltage tails, as a result of single wordline read disturb stress that extend beyond a defined threshold voltage level 352.

In one embodiment, while memory string $306_0$ is designated as a sacrificial string and is inhibited from storing host data written to the block 300, a remainder of the memory strings (i.e., $306_1$-$306_3$) are designated as regular strings configured to store the host data written to the block 300. In one embodiment, charge accumulates on the memory cells $308_0$-$308_N$ of the sacrificial string $306_0$ in association with read operations performed on memory cells in the remainder of the plurality of memory strings. For example, as a result of the higher pass voltage applied to unselected wordlines during a read operation, the memory cells associated with the unselected wordlines, including those in sacrificial string $306_0$, can accumulate some level of charge (i.e., be programed to a certain extent). In one embodiment, the level of charge accumulated on the memory cells $308_0$-$308_N$ of the sacrificial string $306_0$ is indicative of whether a threshold level of read disturb has occurred in the block 300.

In one embodiment, local media controller 135 can periodically perform a string sensing operation on the string of sacrificial memory cells $306_0$ to determine whether read disturb has occurred in block 300. In one embodiment, to perform the string sensing operation a predefined read voltage is applied to each wordline concurrently, and the current through the sacrificial string $306_0$ is sensed. If any of the sacrificial memory cells 308 in the sacrificial string $306_0$ has shifted to a different state, the sacrificial string $306_0$ will not conduct and current will not flow. For example, if either memory cell $308_{x+1}$ or $308_{x-1}$ has shifted to a voltage higher than threshold voltage level 352, sacrificial string $306_0$ will cutoff at that point, and no current will flow through to bitline 304. Thus, local media controller 135 can determine that read disturb is present in the block 300.

Figure 4:
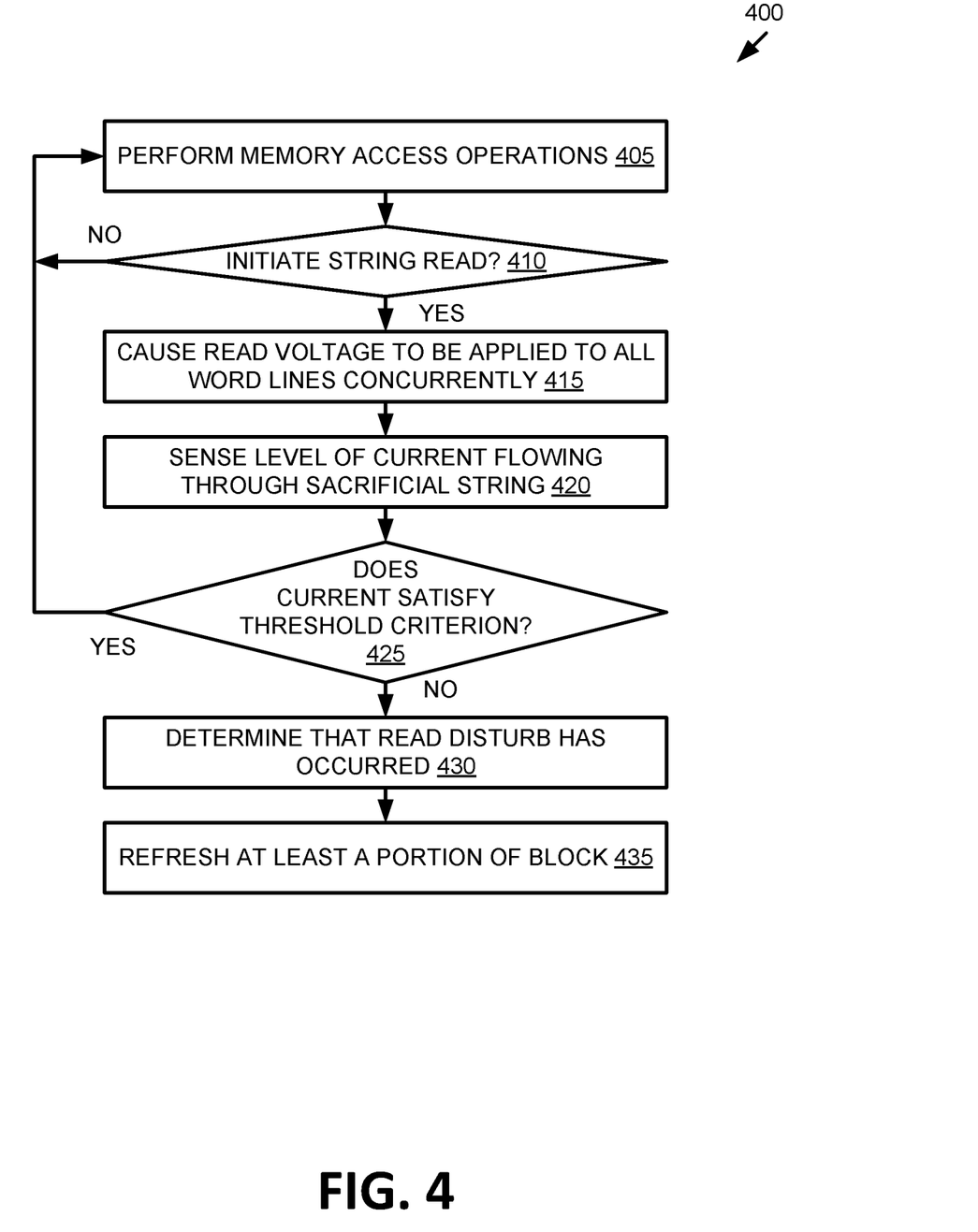
FIG. 4 is a flow diagram of an example method of detecting read disturb in a memory device using sacrificial strings in accordance with some embodiments of the present disclosure.

FIG. 4 is a flow diagram of an example method of detecting read disturb in a memory device using sacrificial strings in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, memory access operations are performed. For example, processing logic (e.g., local media controller 135) can perform one or more memory access operations on a block, such as block 300, of a memory array, such as memory array 104, of a memory device, such as memory device 130. In one embodiment, the memory access operations are performed in response to receiving one or more corresponding memory access commands from a requestor, such as from memory interface 113 of memory sub-system controller 115, or from host system 120. The memory access operations can include, for example, program operations, read operations, and/or erase operations. A read operation for example, can be directed to the memory cells associated with one or more wordlines (e.g., a selected wordline) of block 300 of memory array 104. In one embodiment, to perform the read operation, local media controller 135 can cause a read voltage to be applied to the selected wordline, and a pass voltage to be applied to the unselected wordlines (e.g., a higher pass voltage is applied to those unselected wordlines immediately adjacent to the selected wordline on either side, and a lower pass voltage is applied to those unselected wordlines not immediately adjacent to the selected wordline).

At operation 410, a determination is made. For example, the processing logic can determine whether to initiate a string read operation on a first memory string, such as memory string $306_0$ of block 300, where the first memory string has been designated as a sacrificial string. In one embodiment, block 300 includes one or more sacrificial strings which are inhibited from storing host data written to the block. For example, the sacrificial strings can be omitted from an addressable memory region accessible to a requestor, such as memory sub-system controller 115 or host system 120. In one embodiment, memory sub-system controller 115 can track a number of read operations performed on a block, or other segment, of memory array 204 (e.g., using a read access counter) and can notify local media controller when the number of read operations performed, as indicated by the value of the counter, satisfies a threshold criterion. In one embodiment, the threshold criterion is satisfied when the value of the counter meets or exceeds a defined threshold value. In one embodiment, local media controller 135 can receive a string read command from memory sub-system controller 115 when the threshold criterion is satisfied, and in response, local media controller 135 can initiate a string read operation. In another embodiment, local media controller 135 can track the number of read operations performed itself, determine if the threshold criterion is satisfied, and initiate the string read operation, without relying on memory sub-system controller 115. If the processing logic determines not to initiate a string read operation, processing can return to operation 405 and additional memory access operations can be performed.

If, however, the processing logic determines to initiate a string read operation, at operation 415, a read voltage is applied. For example, the processing logic can cause a read voltage (e.g., Vread) to be applied to each wordline, such as $WL_0$—$WL_N$, of the block 300 concurrently. In one embodiment, local media controller 135 can send control signals to one or more signal drivers configured to apply the read voltage to the wordlines.

At operation 420, a current is sensed. For example, the processing logic can sense a level of current flowing through the sacrificial string $306_0$ of block 300 while the read voltage is applied to each of the wordlines. In one embodiment, local media controller can apply a control signal $SGD_0$ to a select gate device $312_0$ associated with the sacrificial string $306_0$ to activate the select gate device $312_0$ and permit current from the common source to flow through the string and onto bitline 304. Local media controller can then measure the level of current on bitline 304. In one embodiment, the memory cells $308_0$-$308_N$ of the sacrificial string $306_0$ are initialized to a default voltage state (e.g., an erased state referred to as L0) prior to host data being written to the block 300. One or more of the memory cells may shift to from the default voltage state to a higher voltage state (e.g., L1) responsive to experiencing read disturb and will not conduct when the sacrificial string $306_0$ is sensed. As a result, the current flowing through sacrificial string $306_0$ and sensed by the control logic may be reduced or even cutoff completely.

At operation 425, a determination is made. For example, the processing logic can identify whether a threshold level of read disturb has occurred on the block 300. In one embodiment, the local media controller 135 can determine whether the level of current sensed from the sacrificial string $306_0$ during the string read operation satisfies a threshold criterion. In one embodiment, the level of current satisfied the threshold criterion if the level of current meets or exceeds a defined threshold level. In one embodiment, responsive to the level of current flowing through the sacrificial string $306_0$ satisfying the threshold criterion, the processing logic can determine that the threshold level of read disturb has not occurred on the block 300, and can return to operation 405 and additional memory access operations can be performed.

If, however, the processing logic determines that the level of current flowing through the sacrificial string $306_0$ does not satisfy the threshold criterion, at operation 430, a determination is made. For example, the processing logic can determine that the threshold level of read disturb has occurred on the block 300.

At operation 435, corrective action is taken. For example, the processing logic can perform a refresh operation on at least a portion of the block 300. In one embodiment, local media controller 135 can perform a data integrity check (e.g., a "scan") to identify the specific wordlines in the block 300 experiencing the highest levels of read disturb, and then refresh only the memory cells associated with those specific wordlines. In another embodiment, local media controller 135 can instead refresh the entire block 300 without identifying the specific wordlines impacted by single wordline read disturb. For example, the processing logic can relocate the data from the block 300 to another block and reset the read count value of a read counter (e.g., to 0 or to some other initial value) associated with the new block.

Figure 5:
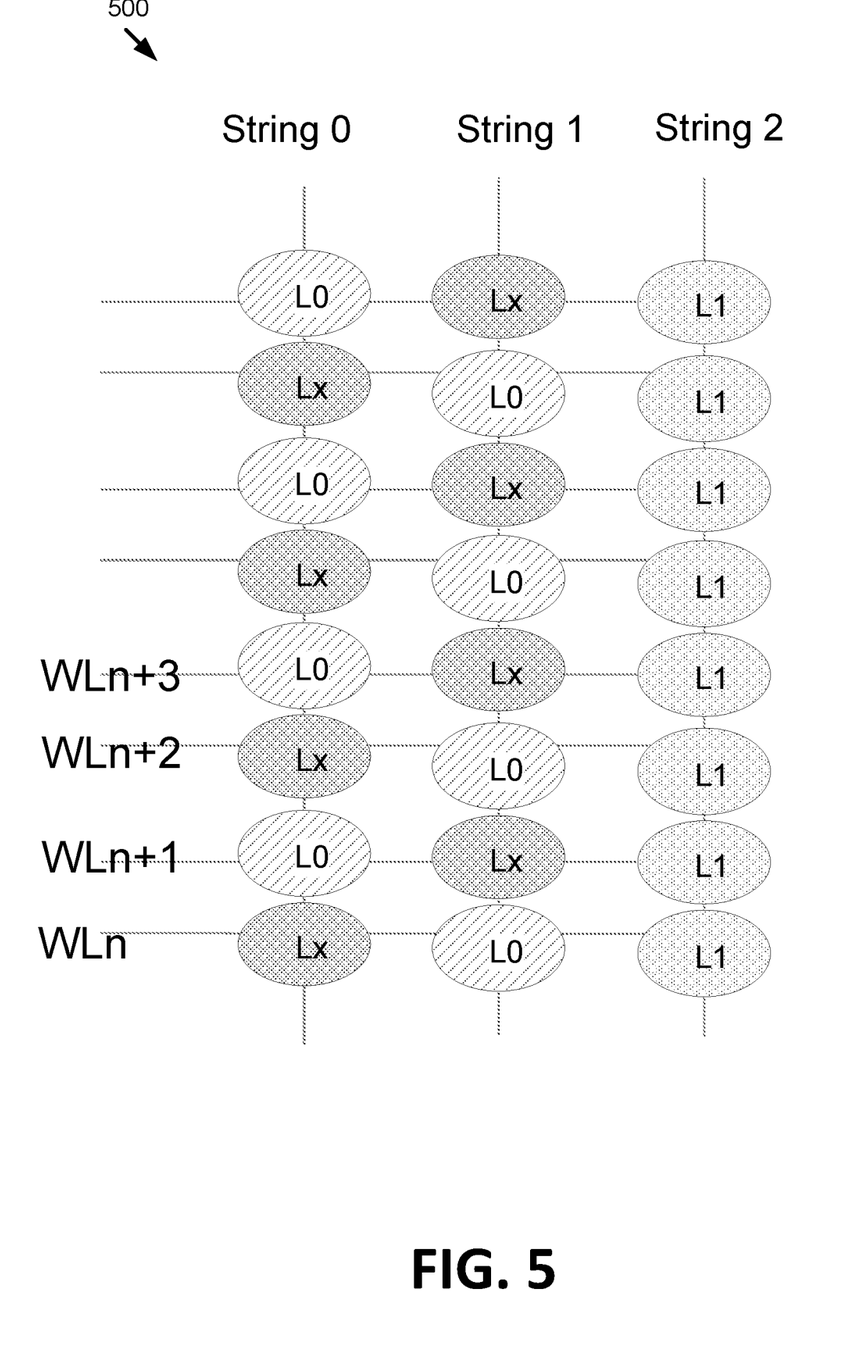
FIG. 5 is a diagram illustrating an alternative implementation of sacrificial strings in a memory device in accordance with some embodiments of the present disclosure.

FIG. 5 is a diagram illustrating an alternative implementation of sacrificial strings in a memory device in accordance with some embodiments of the present disclosure. Depending on the embodiment, multiple strings in a block of the memory array can be designated as sacrificial strings, and the sacrificial cells in those sacrificial strings can be initialized to different voltage states. As illustrated in FIG. 5, for example, String 0 and String 1 of block 500 are designated as sacrificial strings, and each of String 0 and String 1 include a sacrificial memory cell associated with each of the wordlines in the block. In one embodiment, the sacrificial memory cells in String 0 associated with odd wordlines (e.g., WLn+1, WLn+3, etc.) are initialized in a default erased state (i.e., L0), while the sacrificial memory cells associated with even wordlines (e.g., WLn, WLn+2, etc.) are initialized to some other higher voltage state (i.e., Lx). Conversely, the sacrificial memory cells in String 1 associated with the odd wordlines (e.g., WLn+1, WLn+3, etc.) are initialized to the higher voltage state (i.e., Lx), while the sacrificial memory cells associated with even wordlines (e.g., WLn, WLn+2, etc.) are initialized in the default erased state (i.e., L0). In one embodiment, String 2 can also be designated as a sacrificial string, but all of the sacrificial memory cells in String 2 can be initialized to some other voltage state (i.e., L1, which is one step above L0 state).

With this pattern of sacrificial memory cells, there are memory cells initialized to the higher voltage state Lx adjacent to the memory cells initialized to the default erased state L0. This arrangement can increase the read disturb sensitivity for the L0 cells. In one embodiment, during the string read operation, the local media controller 135 causes a higher read voltage to be applied to the even wordlines (e.g., WLn, WLn+2, etc.) so that sacrificial memory cells initialized to the higher voltage state Lx are conducting and do not influence the sensing outcome. The local media controller 135 can cause a lower read voltage to be applied to the odd wordlines (e.g., WLn+1, WLn+3, etc.) to detect the row hammer stress on memory cells initialized to the default erased state L0. If there is row hammer stress on any of the odd wordlines the level of charge stored at memory cells initialized to the default erased state L0 will increase causing those cells to turn off, and the sacrificial string will not conduct, which can be detected by a sense amplifier circuit and local media controller 135 can identify the occurrence of the read disturb. The detection of row hammer stress on even wordlines follows a similar approach, except that the read voltages are reversed, such that the higher read voltage is applied to the odd wordlines and the lower read voltage is applied to the even wordlines.

In another embodiment, local media controller 135 can identify a read window budget (i.e., a "valley width") representing an amount of voltage margin between distributions representing the level of charge stored on the memory cells initialized to the default erased state L0 (e.g., from String 1) and the memory cells in String 2 initialized to the L1 voltage state. For example, local media controller 135 can initiate a string read operation on both String 1 and String 2, determine the read window budget, and compare the read window budget to an expected threshold level. If the read window budget has fallen below the expected threshold level, local media controller 135 can determine that a threshold level of read disturb has occurred in block 500.

Depending on the embodiment, the memory cells initialized to the higher voltage state Lx can be initialized to any higher voltage state, such as L7 for TLC memory. In addition, in other embodiments, some other pattern can be utilized with different percentages of memory cells initialized to the L0 and Lx states (e.g., one third L0 cells and two thirds L7 cells, etc.).

Figure 6:
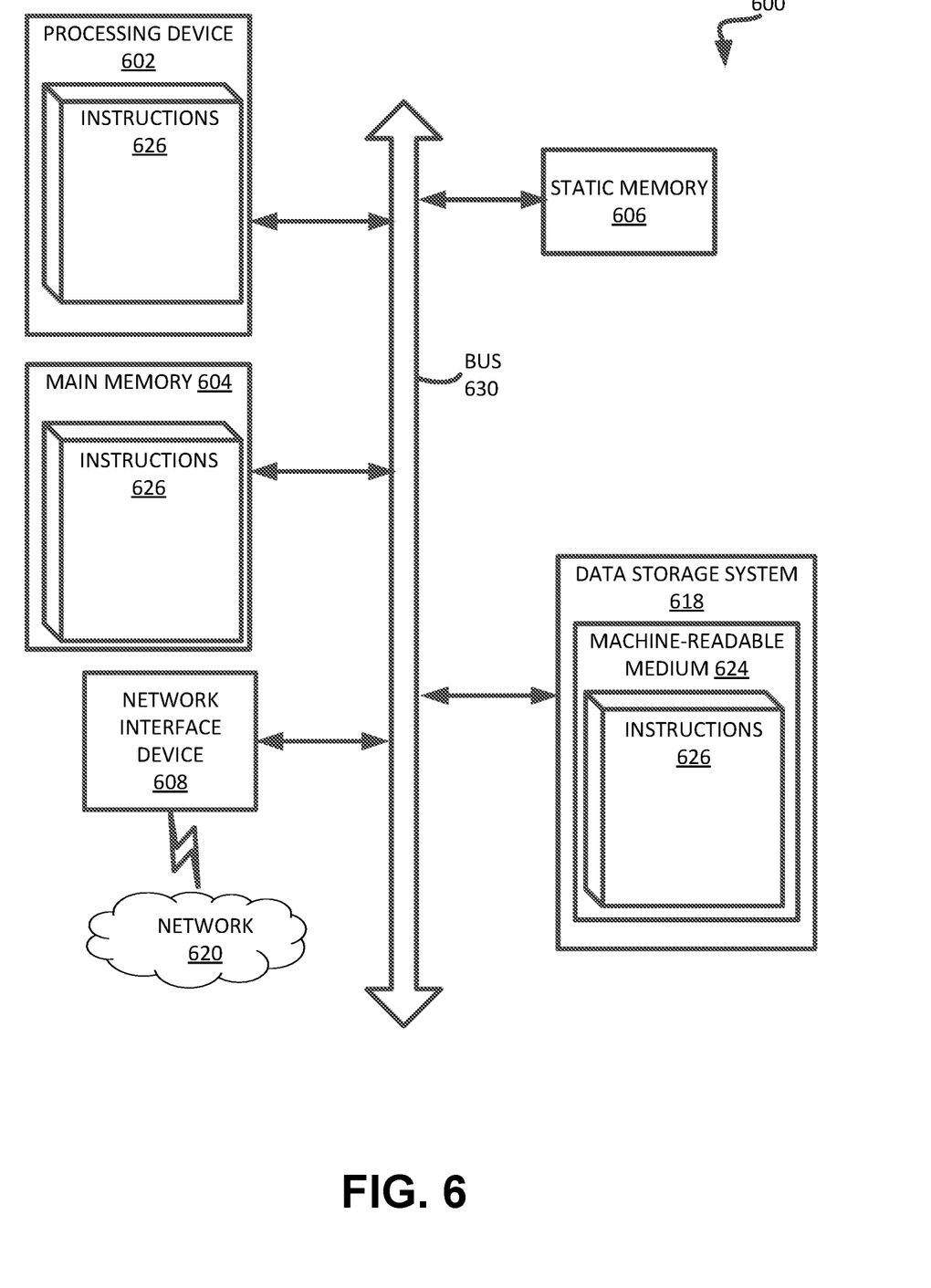
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the local media controller 135 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to the local media controller 135 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array comprising a block, the block comprising a plurality of wordlines and a plurality of memory strings each comprising a plurality of memory cells associated with the plurality of wordlines; and
   control logic, operatively coupled with the memory array, to perform operations comprising:
      determining to initiate a string read operation on a first memory string of the plurality of memory strings, wherein the first memory string is designated as a sacrificial string;
      causing a read voltage to be applied to each of the plurality of wordlines of the block concurrently;
      sensing a level of current flowing through the first memory string designated as the sacrificial string while the read voltage is applied to each of the plurality of wordlines; and
      identifying, based on the level of current flowing through the first memory string designated as the sacrificial string, whether a threshold level of read disturb has occurred on the block.

2. The memory device of claim 1, wherein determining to initiate the string read operation on the first memory string comprises determining that a number of read operations performed on the block satisfies a first threshold criterion.

3. The memory device of claim 1, wherein the first memory string designated as the sacrificial string is inhibited from storing host data written to the block.

4. The memory device of claim 1, wherein the first memory string designated as the sacrificial string comprises a first plurality of memory cells, wherein each of the first plurality of memory cells is associated with a respective one of the plurality of wordlines.

5. The memory device of claim 4, wherein each of the first plurality of memory cells is initialized to a default voltage state prior to host data being written to the block, and wherein one or more of the first plurality of memory cells are to shift to from the default voltage state to a higher voltage state responsive to experiencing read disturb and will not conduct when the first memory string is sensed.

6. The memory device of claim 5, wherein a first subset of the first plurality of memory cells is initialized to a first voltage state and a second subset of the first plurality of memory cells is initialized to a second voltage state, wherein the first subset and the second subset comprise alternating memory cells in the first memory string.

7. The memory device of claim 5, wherein identifying whether the threshold level of read disturb has occurred on the block comprises:
   responsive to the level of current flowing through the first memory string designated as the sacrificial string satisfying a second threshold criterion, determining that the threshold level of read disturb has not occurred on the block.

8. The memory device of claim 7, wherein identifying whether the threshold level of read disturb has occurred on the block comprises:
responsive to the level of current flowing through the first memory string designated as the sacrificial string not satisfying the second threshold criterion, determining that the threshold level of read disturb has occurred on the block.

9. A method comprising:
determining to initiate a string read operation on a first memory string of a plurality of memory strings in a block of a memory array of a memory device, the block comprising a plurality of wordlines, wherein each of the plurality of memory strings comprises a plurality of memory cells associated with the plurality of wordlines, and wherein the first memory string is designated as a sacrificial string;
causing a read voltage to be applied to each of the plurality of wordlines of the block concurrently;
sensing a level of current flowing through the first memory string designated as the sacrificial string while the read voltage is applied to each of the plurality of wordlines; and
identifying, based on the level of current flowing through the first memory string designated as the sacrificial string, whether a threshold level of read disturb has occurred on the block.

10. The method of claim 9, wherein determining to initiate the string read operation on the first memory string comprises determining that a number of read operations performed on the block satisfies a first threshold criterion.

11. The method of claim 9, wherein the first memory string designated as the sacrificial string is inhibited from storing host data written to the block.

12. The method of claim 9, wherein the first memory string designated as the sacrificial string comprises a first plurality of memory cells, wherein each of the first plurality of memory cells is associated with a respective one of the plurality of wordlines.

13. The method of claim 9, wherein each of the first plurality of memory cells is initialized to a default voltage state prior to host data being written to the block.

14. The method of claim 13, wherein one or more of the first plurality of memory cells are to shift to from the default voltage state to a higher voltage state responsive to experiencing read disturb and will not conduct when the first memory string is sensed.

15. The method of claim 14, wherein identifying whether the threshold level of read disturb has occurred on the block comprises:
responsive to the level of current flowing through the first memory string designated as the sacrificial string satisfying a second threshold criterion, determining that the threshold level of read disturb has not occurred on the block.

16. The method of claim 15, wherein identifying whether the threshold level of read disturb has occurred on the block comprises:
responsive to the level of current flowing through the first memory string designated as the sacrificial string not satisfying the second threshold criterion, determining that the threshold level of read disturb has occurred on the block.

17. A memory device comprising:
a memory array comprising a block, the block comprising a plurality of wordlines and a plurality of memory strings each comprising a plurality of memory cells associated with the plurality of wordlines,
wherein a first memory string of the plurality of memory strings is designated as a sacrificial string and is inhibited from storing host data written to the block, the first memory string comprising a first plurality of memory cells each associated with a respective one of the plurality of wordlines,
wherein a remainder of the plurality of memory strings are designated as regular strings configured to store the host data written to the block;
wherein charge accumulates on the first plurality of memory cells in association with read operations performed on memory cells in the remainder of the plurality of memory strings, and
wherein a level of charge accumulated on the first plurality of memory cells is read using a read voltage applied to each of the plurality of wordlines concurrently and is indicative of whether a threshold level of read disturb has occurred in the block.

18. The memory device of claim 17, further comprising:
control logic, operatively coupled with the memory array, to perform operations comprising:
periodically performing a string read operation on the first memory string designated as the sacrificial string to determine the level of charge accumulated on the first plurality of memory cells.

19. The memory device of claim 18, wherein the control logic is to perform operations further comprising:
responsive to the level of charge accumulated on any one of the first plurality of memory cells satisfying a threshold criterion, determining that the threshold level of read disturb has occurred.

20. The memory device of claim 19, wherein the control logic is to perform operations further comprising:
responsive to determining that the threshold level of read disturb has occurred, performing a refresh operation on at least a portion of the block.

* * * * *